(12) United States Patent
Hashimoto (10) Patent No.: US 6,977,441 B2
(45) Date of Patent: Dec. 20, 2005

(54) INTERCONNECT SUBSTRATE AND METHOD OF MANUFACTURE THEREOF, ELECTRONIC COMPONENT AND METHOD OF MANUFACTURING THEREOF, CIRCUIT BOARD AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/788,397

(22) Filed: Mar. 1, 2004

(65) Prior Publication Data

US 2004/0164396 A1 Aug. 26, 2004

Related U.S. Application Data

(62) Division of application No. 09/807,601, filed as application No. PCT/JP00/05395 on Aug. 11, 2000, now abandoned.

(30) Foreign Application Priority Data

Aug. 19, 1999 (JP) .................. 11-232565

(51) Int. Cl.⁷ .................. H01L 23/48; H01L 23/52; H01L 29/40
(52) U.S. Cl. .................. 257/777; 257/685; 257/686; 257/688; 257/689; 257/723; 257/730; 257/773; 257/776; 257/778
(58) Field of Search .................. 257/777, 778, 257/685–686, 688–689, 723, 730, 773, 776

(56) References Cited

U.S. PATENT DOCUMENTS

| | | | |
|---|---|---|---|
| 3,760,090 A | 9/1973 | Fowler | 174/52.3 |
| 3,780,352 A | 12/1973 | Redwanz | 361/792 |
| 3,888,639 A | 6/1975 | Hastings et al. | 29/830 |
| 4,449,769 A | 5/1984 | Kobayashi | 439/83 |
| 4,599,636 A * | 7/1986 | Roberts et al. | 257/665 |
| 4,817,280 A | 4/1989 | Ozaki | 29/846 |
| 4,914,259 A | 4/1990 | Kobayashi | 174/255 |
| 4,935,584 A | 6/1990 | Boggs | 358/296 |
| 5,004,639 A | 4/1991 | Desai | 428/138 |
| 5,128,831 A | 7/1992 | Fox et al. | 361/735 |
| 5,142,448 A | 8/1992 | Kober et al. | 361/751 |
| 5,239,448 A | 8/1993 | Perkins et al. | 361/764 |
| 5,384,691 A | 1/1995 | Neugebauer et al. | 361/794 |
| 5,448,511 A * | 9/1995 | Paurus et al. | 365/52 |
| 5,508,565 A * | 4/1996 | Hatakeyama et al. | 257/777 |
| 5,604,379 A * | 2/1997 | Mori | 257/738 |
| 5,637,828 A * | 6/1997 | Russell et al. | 174/52.2 |
| 5,776,797 A * | 7/1998 | Nicewarner et al. | 438/107 |
| 5,789,815 A * | 8/1998 | Tessier et al. | 257/723 |
| 5,793,108 A * | 8/1998 | Nakanishi et al. | 257/723 |
| 5,804,874 A * | 9/1998 | An et al. | 257/676 |
| 5,977,640 A * | 11/1999 | Bertin et al. | 257/777 |
| 6,014,316 A * | 1/2000 | Eide | 361/735 |
| 6,084,294 A * | 7/2000 | Tomita | 257/686 |

(Continued)

FOREIGN PATENT DOCUMENTS

EP A2 0 540 247 5/1993

(Continued)

*Primary Examiner*—Michael Trinh
*Assistant Examiner*—Ida M. Soward
(74) *Attorney, Agent, or Firm*—Oliff & Berridge, PLC (57) ABSTRACT

An interconnect substrate including a first substrate on which a first interconnect pattern is formed, having a mounting region for an electronic chip; and a second substrate on which a second interconnect pattern electrically connected to the first interconnect pattern is formed. The second substrate includes a region to which at least a part of the first substrate is adhered, and a mounting region for an electronic chip.

6 Claims, 6 Drawing Sheets

U.S. PATENT DOCUMENTS

| | | | |
|---|---|---|---|
| 6,118,176 A * | 9/2000 | Tao et al. | 257/676 |
| 6,121,676 A * | 9/2000 | Solberg | 257/723 |
| 6,208,521 B1 * | 3/2001 | Nakatsuka | 361/749 |
| 6,225,688 B1 * | 5/2001 | Kim et al. | 257/686 |
| 6,252,176 B1 | 6/2001 | Kuramochi et al. | 174/255 |
| 6,300,679 B1 * | 10/2001 | Mukerji et al. | 257/738 |

FOREIGN PATENT DOCUMENTS

| | | |
|---|---|---|
| JP | A 62-117391 | 5/1987 |
| JP | A 04-196350 | 7/1992 |
| JP | B2 06-058941 | 8/1994 |
| JP | A 09-232377 | 9/1997 |
| JP | A 11-112144 | 4/1999 |
| JP | A 11-112150 | 4/1999 |
| JP | A 11-135715 | 5/1999 |

* cited by examiner

INTERCONNECT SUBSTRATE AND METHOD OF MANUFACTURE THEREOF, ELECTRONIC COMPONENT AND METHOD OF MANUFACTURING THEREOF, CIRCUIT BOARD AND ELECTRONIC INSTRUMENT

This is a Division of application Ser. No. 09/807,601 filed Apr. 16, 2001, which in turn claims priority under 35 U.S.C. §365 of Japanese Patent Application No. 11-232565 filed Aug. 19, 1999 in Japan for National Stage of PCT/JP00/05395 on Sep. 11, 2000. The entire disclosures of the prior applications, together with the foreign priority application, are hereby incorporated by reference in their entirety.

TECHNICAL FIELD

The present invention relates to an interconnect substrate and method of manufacture thereof, to an electronic component and method of manufacture thereof, to a circuit board and to an electronic instrument.

BACKGROUND ART

In recent years the mounting density of electronic components has continued to rise, and very fine interconnect substrates are required. There is a limit to the degree to which the pattern of an interconnect substrate can be made finer when forming the interconnect pattern on one surface of the substrate only, and therefore built-up interconnect substrates have sometimes been used.

However, a built-up interconnect substrate requires repeated steps of applying an interconnect and an insulating layer, and photosensitive resin and other expensive materials, and it has therefore not been possible to reduce the cost to that of a conventional printed interconnect substrate.

DISCLOSURE OF THE INVENTION

The present invention solves this problem, and has as its object the provision of an inexpensive interconnect substrate and method of manufacture thereof, an electronic component and method of manufacture thereof, a circuit board, and an electronic instrument.

(1) In an interconnect substrate of the present invention, a first substrate on which a first interconnect pattern is formed and a second substrate on which a second interconnect pattern is formed are disposed in superimposition;

at least one of the first interconnect pattern and the second interconnect pattern has a mounting region for an electronic chip; and the first interconnect pattern and the second interconnect pattern are electrically connected.

According to the present invention, the first and second substrates which are single-sided substrates are used, but the functionality of a double-sided substrate can be obtained. It should be noted that the interconnect substrate of the present invention differs from a conventional multi-layer substrate in that both of the first and second substrates have mounting regions for an electronic chip.

(2) In this interconnect substrate, the second substrate may be larger than the first substrate, and the whole of the first substrate may be adhered to the second substrate.

By means of this, the outline of the second substrate can be an outline of the interconnect substrate, and the construction is one in which the first and second substrates are partially overlapped.

(3) In this interconnect substrate, the first interconnect pattern may be formed on one surface of the first substrate;

the second interconnect pattern may be formed on one surface of the second substrate; and a surface of the first substrate opposite to the surface on which the first interconnect pattern is formed and the surface of the second substrate on which the second interconnect pattern is formed may be disposed to oppose each other.

By means of this, the first and second interconnect patterns formed on the first and second substrates are disposed with the same alignment.

(4) In this interconnect substrate, a plurality of through-holes may be formed in the first substrate, and the first interconnect pattern and the second interconnect pattern may be electrically connected via the through-holes.

(5) In this interconnect substrate, the first interconnect pattern may pass over the through-holes;

the through-holes may be positioned over the second interconnect pattern; and a conductive material contacting the first and second interconnect pattern may be provided within the through-holes.

(6) In this interconnect substrate, the through-holes may be positioned over the second interconnect pattern; and a part of the first interconnect pattern may enter the through-holes, and may be connected to the second interconnect pattern.

(7) In this interconnect substrate, a plurality of through-holes may be formed in the second substrate, for the formation of a plurality of external terminals electrically connected to the second interconnect pattern and projecting from a surface of the second substrate opposite to the surface on which the second interconnect pattern is formed.

(8) In this interconnect substrate, the through-holes formed in the first substrate and the through-holes formed in the second substrate may be formed in communicating positions.

(9) In this interconnect substrate, a part of the second interconnect pattern may enter the through-holes formed in the first substrate, and may be connected to the first interconnect pattern.

(10) In this interconnect substrate, a part of the first interconnect pattern and a part of the second interconnect pattern may project from a surface of the second substrate via the through-holes formed in the second substrate and form external terminals.

(11) In this interconnect substrate, a part of the second interconnect pattern may project into the through-holes formed in the second substrate, avoiding contact with the first interconnect pattern.

(12) In this interconnect substrate, the first and second substrates may be adhered by an anisotropic conductive film including conductive particles.

(13) In this interconnect substrate, the first and second interconnect patterns may be electrically connected by the conductive particles.

(14) An electronic component of the present invention comprises:

a first substrate on which a first interconnect pattern is formed;

a second substrate having a region which at least a part of the first substrate is disposed opposing, on which a second interconnect pattern is formed electrically connected to the first interconnect pattern; and an electronic chip electrically connected to at least one of the first interconnect pattern and the second interconnect pattern.

According to the present invention, an interconnect substrate is used which yields the functionality of a double-sided substrate by means of the first and second substrates which are single-sided substrates. It should be noted that the electronic component of the present invention differs from an electronic component using a conventional multi-layer substrate in that both of the first and second substrates have an electronic chip mounted.

(15) In this electronic component, a surface of the first substrate opposite to a surface on which the first interconnect pattern is formed, and a surface of the second substrate on which the second interconnect pattern is formed may be adhered together.

By means of this, the first and second interconnect patterns formed on the first and second substrates are disposed with the same alignment.

(16) In this electronic component, a plurality of through-holes may be formed in the first substrate, and the first interconnect pattern and the second interconnect pattern may be electrically connected via the through-holes.

(17) In this electronic component, a plurality of through-holes may be formed in the second substrate; and external terminals electrically connected to the second interconnect pattern via the through-holes formed in the second substrate may be provided.

(18) In this electronic component, the through-holes formed in the first substrate and the through-holes formed in the second substrate may be formed in communicating positions; and the external terminals may contact the second interconnect pattern via the through-holes formed in the second substrate, and may be provided on the first interconnect pattern via the through-holes formed in the first substrate.

(19) In this electronic component, an anisotropic conductive film including conductive particles may be provided on the surface of the second substrate on which the second interconnect pattern is formed; and the anisotropic conductive film may adhere the first substrate to the second substrate, while also electrically connecting the second interconnect pattern to the electronic chip.

(20) In this electronic component, the second substrate may be bent to adhere a first electronic chip mounted on the first substrate to a second electronic chip mounted on the second substrate.

(21) On a circuit board of the present invention, the above-described electronic component is mounted.

(22) An electronic instrument of the present invention is equipped with the above-described electronic component.

(23) A method of manufacture of an interconnect substrate of the present invention comprises:

a disposition step of disposing at least a part of a first substrate on which a first interconnect pattern is formed to oppose a region of a second substrate on which a second interconnect pattern is formed excluding a mounting region of an electronic chip; and a connection step of electrically connecting the first and second interconnect patterns.

According to the present invention, using first and second substrates which are single-sided substrates, an interconnect substrate which yields the functionality of a double-sided substrate can be fabricated. It should be noted that the interconnect substrate manufactured by the method of the present invention differs from a conventional multi-layer substrate in that both of the first and second substrates have mounting regions for an electronic chip.

(24) In this method of manufacture of an interconnect substrate, a surface of the first substrate opposite to a surface on which the first interconnect pattern is formed may be adhered to a surface of the second substrate on which the second interconnect pattern is formed, in the disposition step; and a plurality of through-holes may be formed in the first substrate, and the first interconnect pattern may be formed to pass over the through-holes.

(25) In this method of manufacture of an interconnect substrate, a conductive material may be provided on the first interconnect pattern via the through-holes formed in the first substrate, before the disposition step; and when adhering the first substrate to the second substrate in the disposition step, the conductive material may be contacted with the second interconnect pattern, whereby the connection step is carried out.

By means of this, a part of the connection step is carried out in the disposition step, and thus the process can be simplified.

(26) In this method of manufacture of an interconnect substrate, a part of the first interconnect pattern may be bent into the through-holes formed in the first substrate, and connected to the second interconnect pattern, in the connection step.

(27) In this method of manufacture of an interconnect substrate, a plurality of through-holes may be formed in the second substrate; and the through-holes formed in the first and second substrates may be formed in communicating positions.

(28) In this method of manufacture of an interconnect substrate, a part of the second interconnect pattern may be bent into the through-holes formed in the first substrate, and connected to the first interconnect pattern, in the connection step.

(29) In this method of manufacture of an interconnect substrate, a part of the first interconnect pattern and a part of the second interconnect pattern may be integrally caused to project from a surface of the second substrate via the through-holes formed in the second substrate, to form external terminals, in the connection step.

(30) In this method of manufacture of an interconnect substrate, a material for external terminals may be contacted with the second interconnect pattern, and provided on the first interconnect pattern via the through-holes formed in the first and second substrates, in the connection step.

By means of this, when forming the external terminals, the electrical connection of the first and second interconnect patterns can also be carried out.

(31) In this method of manufacture of an interconnect substrate, positioning holes may be formed in the first and second substrates; and before the disposition step, a step may be included in which a jig is put into the positioning holes and the first and second substrates are positioned.

(32) A method of manufacture of an electronic component of the present invention comprises:

a disposition step of adhering at least a part of a first substrate on which a first interconnect pattern is formed, having a mounting region for an electronic chip, to a region of a second substrate on which a second interconnect pattern is formed excluding a mounting region for an electronic chip;

a connection step of electrically connecting the first and second interconnect patterns;

a first mounting step of mounting a first electronic chip to be electrically connected to the first interconnect pattern on the first substrate; and a second mounting step of mounting a second electronic chip to be electrically connected to the second interconnect pattern on the mounting region of an electronic chip of the second substrate.

According to the present invention, an electronic component can be manufactured by using an interconnect substrate which yields the functionality of a double-sided substrate by means of the first and second substrates which are single-sided substrates. It should be noted that the electronic component fabricated according to the present invention differs from an electronic component using a conventional multi-layer substrate in that both of the first and second substrates have an electronic chip mounted.

(33) In this method of manufacture of an electronic component, a surface of the first substrate opposite to a surface on which the first interconnect pattern is formed may be adhered to a surface of the second substrate on which the second interconnect pattern is formed, in the disposition step; and a plurality of through-holes may be formed in the first substrate, and the first interconnect pattern may be formed to pass over the through-holes.

(34) In this method of manufacture of an electronic component, a plurality of through-holes may be formed in the second substrate; and the through-holes formed in the first and second substrates may be formed in communicating positions.

(35) In this method of manufacture of an electronic component, a material for external terminals may be contacted with the second interconnect pattern, and provided on the first interconnect pattern via the through-holes formed in the first and second substrates, in the connection step.

By means of this, when forming the external terminals, the electrical connection of the first and second interconnect patterns can be carried out.

(36) In this method of manufacture of an electronic component, in the disposition step and the second mounting step, an anisotropic conductive film including conductive particles may be provided on a surface of the second substrate on which the second interconnect pattern is formed, and the first substrate may be adhered to the second substrate by means of the anisotropic conductive film, while electrically connecting the second interconnect pattern to the second electronic chip.

By means of this, with a single material, the first substrate can be adhered to the second substrate, and the second interconnect pattern can be electrically connected to the second electronic chip, and further, these two steps can be carried out simultaneously.

(37) The electronic component may further comprise:

a step in which the second substrate is bent to adhere the first electronic chip mounted on the first substrate to the second electronic chip mounted on the second substrate.

(38) In this method of manufacture of an electronic component, the disposition step may be carried out after the first mounting step.

(39) In this method of manufacture of an electronic component, the second substrate may be a part of a flexible substrate; and the second substrate may be formed by stamping out the flexible substrate after the disposition step.

BEST MODE FOR CARRYING OUT THE INVENTION

The present invention is now described in terms of a number of preferred embodiments, with reference to the drawings.

First Embodiment

Figure 1:
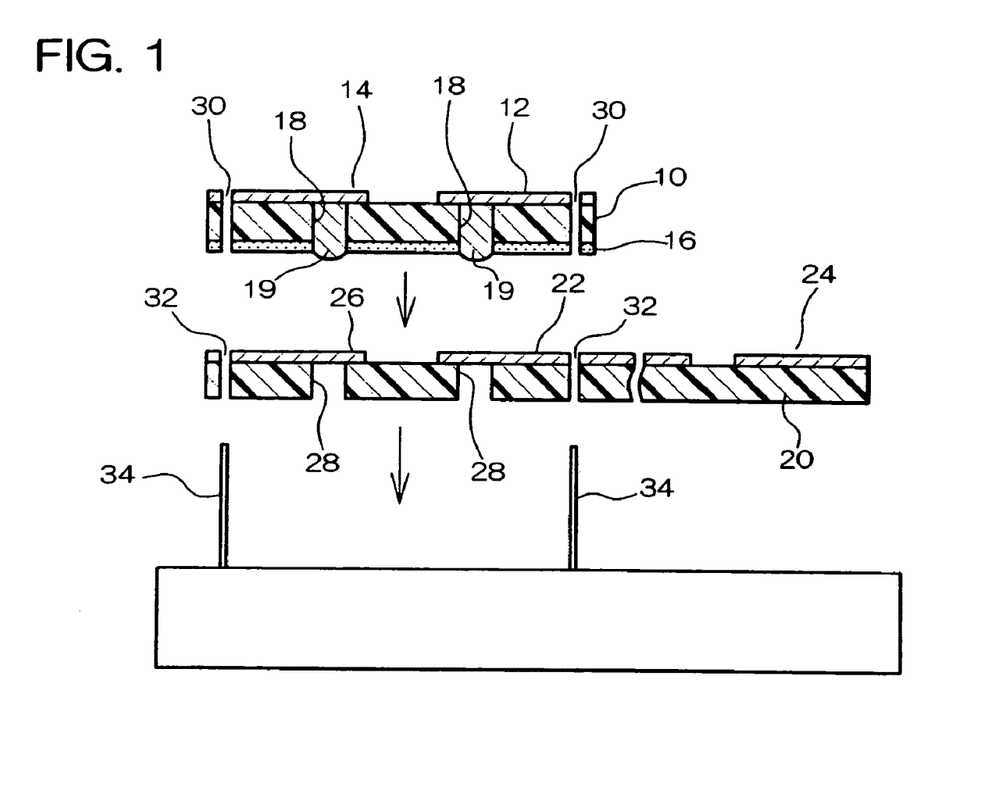
FIG. 1 shows the method of manufacture of an interconnect substrate according to a first embodiment of the present invention.
Figure 2:
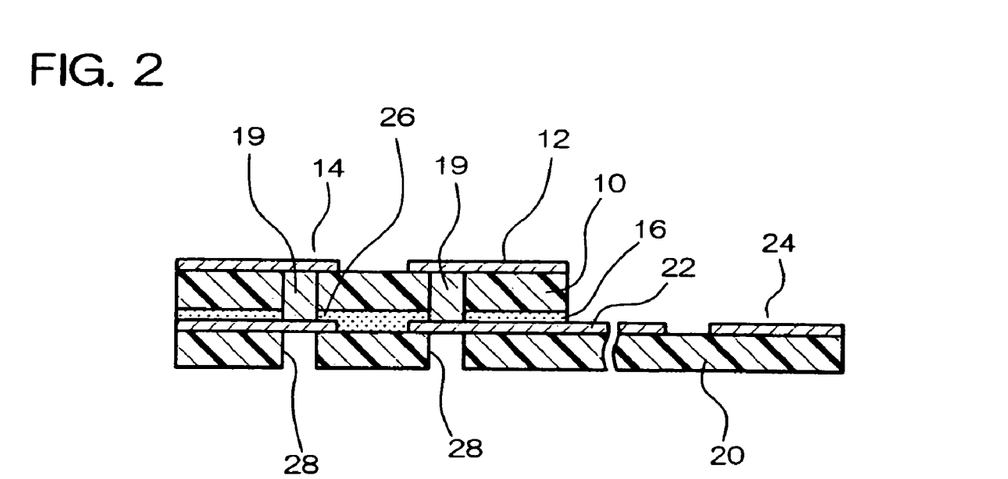
FIG. 2 shows the interconnect substrate according to the first embodiment of the present invention.

FIG. 1 illustrates the method of manufacture of the first embodiment of the interconnect substrate to which the present invention is applied, and FIG. 2 shows the first embodiment of the interconnect substrate to which the present invention is applied.

The interconnect substrate shown in FIG. 1 comprises a first substrate 10 and a second substrate 20, and can be used for example as an interposer of a semiconductor device.

The first and second substrates 10 and 20 may be formed of different materials, or may equally be formed of the same material. As the material may be used an organic material, or equally an inorganic material, or a composite of the two. As a first or second substrate 10 or 20 formed of an organic material may be used for example a flexible substrate formed of polyimide resin. As the flexible substrate may be used a tape used in FPC (Flexible Printed Circuit) or TAB (Tape Automated Bonding) technology. As the first or second substrate 10 or 20 formed of an inorganic material may be cited for example a ceramic substrate or glass substrate. As an example of a composite formation of organic and inorganic materials may be cited for example a glass epoxy substrate. The first and second substrates 10 and 20 may be of different thicknesses or may equally be of the same thickness.

The size and form in plan view of the first and second substrates 10 and 20 is not particularly restricted, but in the example shown in FIGS. 1 and 2, the second substrate 20 is larger than the first substrate 10.

On one surface of the first substrate 10 is formed an interconnect pattern 12. The interconnect pattern 12 can be formed of a conductive material such as copper or the like. The first substrate 10 has a mounting region 14 for an electronic chip such as a semiconductor chip 40 (see FIG. 3). The interconnect pattern 12 may have a pattern in the mounting region 14 corresponding to the electrodes of the electronic chip, and may have lands formed for connection to the electrodes. The interconnect pattern 12 may be adhered to the substrate 10 with an adhesive (not shown in the drawings) interposed, to form a three-layer substrate. Alternatively, the interconnect pattern 12 may be formed on the first substrate 10 without an adhesive, to form a two-layer substrate.

On one surface of the second substrate 20 is formed an interconnect pattern 22. The interconnect pattern 22 can be formed of a conductive material such as copper or the like. The second substrate 20 has a mounting region 24 for an electronic chip such as a semiconductor chip 42 (see FIG. 3), and a region 26 to which at least a part of the first substrate 10 is adhered. The interconnect pattern 22 is formed to span both the mounting region 24 and the region 26. The second interconnect pattern 22 is electrically connected to the first interconnect pattern 12.

In the mounting region 24, the interconnect pattern 22 may have a pattern corresponding to the electrodes of the electronic chip, and may have lands formed for connection to the electrodes. The interconnect pattern 22 may be adhered to the substrate 20 with an adhesive (not shown in the drawings) interposed, to form a three-layer substrate. Alternatively, the interconnect pattern 22 may be formed on the second substrate 20 without an adhesive, to form a two-layer substrate.

In the region 26 of the second substrate 20, at least a part of the first substrate 10 is adhered. For this adhesion, for example an adhesive 16 can be used. If the first substrate 10 is smaller in plane extent than the second substrate 20, the whole of the first substrate 10 may be adhered to the region 26 of the second substrate.

The surface of the first substrate 10 opposite to that on which the first interconnect pattern 12 is formed may be adhered to the surface of the second substrate 20 on which the second interconnect pattern 22 is formed. In this case, between the first and second interconnect patterns 12 and 22, since the first substrate 10 is interposed, for the purposes of electrical connection between the two, a plurality of through-holes 18 are formed in the first substrate 10. In the through-holes 18, a conductive material 19 of solder or the like is provided, and by means of the conductive material 19, electrical conduction between the first and second interconnect patterns 12 and 22 is achieved. More specifically, if the first interconnect pattern 12 passes over the through-holes 18, and the through-holes 18 are positioned over the second interconnect pattern 22, then by means of the conductive material 19 provided within the through-holes 18, the electrical connection of the first and second interconnect patterns 12 and 22 can be achieved. The first and second interconnect patterns 12 and 22 are preferably plated with solder, tin, gold, nickel, or the like.

In the second substrate 20, through-holes 28 are formed. The through-holes 28 serve for electrical connection of a plurality of external terminals 44 (see FIG. 3) to the second interconnect pattern 22. That is to say, the external terminals 44 projecting to the surface of the second substrate 20 opposite to that on which the second interconnect pattern 22 is formed can be electrically connected to the second interconnect pattern 22 via the through-holes 28. For example, if the second interconnect pattern 22 passes over the through-holes 28, then the external terminals 44 can be provided on the second interconnect pattern 22 via the through-holes 28.

The through-holes 18 formed in the first substrate 10, and the through-holes 28 formed in the second substrate 20 may be formed in communicating positions. However, through-holes 18 and 28 do not actually need to communicate, and may be blocked by the second interconnect pattern 22 or the like.

In this embodiment of the interconnect substrate, an inexpensive single-sided substrate is used, and has the functions of a built-up substrate or multi-layer substrate. That is to say, the first interconnect pattern 12 of the first substrate 10 and the second interconnect pattern 22 of the second substrate 20 are superimposed, and therefore a finely detailed interconnect is possible. Since both first and second substrates 10 and 20 have the mounting regions 14 and 24, a plurality of electronic chips such as the semiconductor chips 40 and 42 (see FIG. 3) or the like can be mounted.

This embodiment of the interconnect substrate is constructed as described above, and the method of manufacture thereof is now described.

First, the first and second substrates 10 and 20 are taken. The first and second substrates 10 and 20 can be formed by stamping out a flexible substrate. The flexible substrate may be in a tape form. The flexible substrate may first have the first or second interconnect patterns 12 and 22 or through-holes 18 and 28, and so on formed, before the stamping out.

When the second substrate 20 is formed by stamping out a flexible substrate, the first substrate 10 may be adhered to the flexible substrate before the stamping out. Furthermore, a first flexible substrate on which a plurality of first substrates 10 are formed may be adhered to a second flexible substrate on which a plurality of second substrates 20 are formed, and the second flexible substrate stamped out to the external form of each of the second substrates 20. By doing this, the first substrates 10 are also cut apart.

Then a disposition step, adhering at least a part of the first substrate 10 to the region 26 of the second substrate 20 excluding the electronic component mounting region 24, and a step of connection, electrically connecting the first and second interconnect patterns 12 and 22, are carried out.

Before the disposition step, or as part of the disposition step, positioning of the first and second substrates 10 and 20 is preferably carried out. For example, as shown in FIG. 1, positioning holes 30 and 32 may be formed in the first and second substrates 10 and 20 so as to be communicating when the positioning is achieved, and the positioning carried out by inserting a jig 34 consisting of pins or the like.

In the disposition step, the surface of the first substrate 10 opposite to that on which the first interconnect pattern 12 is formed, and the surface of the second substrate 20 on which the second interconnect pattern 22 is formed, may be adhered. For the adhesion, the adhesive 16 may be used.

The adhesive 16 may be provided in sheet form, may be provided as a liquid or gel. When provided in sheet form, the adhesive 16 exhibits adhesion as a result of the application of heat and pressure. The characteristics of the adhesive 16 may be either thermosetting or thermoplastic. As the adhesive 16 may be used a sheet form of epoxy resin, or a thermoplastic polyimide resin may be used.

The adhesive 16 may be provided on at least either of the first substrate 10 and second substrate 20. When the adhesive 16 used is insulating, the adhesive 16 is preferably provided avoiding the electrical connection portion of the first and second interconnect patterns 12 and 22. In more detail, the adhesive 16 is provided to avoid the conductive material 19 and the bonding portion of the second interconnect pattern 22 with the conductive material 19. For example, when the adhesive 16 is adhered in sheet form to the first substrate 10, the portions of the adhesive 16 overlying the position of formation of the conductive material 19 may first have holes formed, after which the adhesive 16 is adhered to the first substrate 10. Such holes may be formed by stamping using a jig not shown in the drawings.

Alternatively, after adhering the adhesive 16 to the first substrate 10, at the same time as forming the through-holes 18 in the first substrate 10, holes may be formed in the adhesive 16 to communicate with the through-holes 18. By means of this, a separate step of forming holes in the adhesive 16 can be omitted. In this case, since when the first substrate 10 is formed the adhesive 16 is already adhered, the adhesive 16 is selected not to lose its adhesive force as a result of heat applied in process steps until the first and second substrates 10 and 20 are adhered. For example, the adhesive 16 may employ a thermoplastic substance (for example thermoplastic polyimide resin).

By means of the disposition step, a part of the step of connection may be carried out. For example, before the disposition step the conductive material 19 is provided in the through-holes 18 formed in the first substrate 10. As the conductive material 19 can be used solder, high-temperature solder, cream solder, or the like. Then in the disposition step, when the first and second substrates 10 and 20 are adhered, the conductive material 19 contacts the second interconnect pattern 22, whereby at least a part of the connection step may be carried out.

If the conductive material 19 is soft, the conductive material 19 is provided in the through-holes 18 to the extent of overflowing from the surface of the first substrate 10 or when the adhesive 16 is provided the surface thereof. By doing this, by means of the disposition step, the first and second interconnect patterns 12 and 22 can be electrically connected.

If the conductive material 19 is hard at room temperature, then after the disposition step, the conductive material 19 is heated and fused, so that the first and second interconnect patterns 12 and 22 are electrically connected. The heating may be carried out in a reflow process when forming the external terminals 44 (see FIG. 3), or when mounting the semiconductor device on a circuit board.

In the above embodiment, an example was described in which substrates with an interconnect pattern formed on one side of the substrate are superimposed together, but within the range in which superimposing two substrates is less costly, multi-layer substrates including built-up substrates may be superimposed together, or a multi-layer substrate and a single-sided substrate may be superimposed together.

In the above embodiment, the construction was described in which through the upper substrate the interconnect patterns of the upper and lower substrates are connected together, but the construction is also possible in which the interconnect pattern of the upper substrate and the interconnect pattern of the lower substrate oppose each other to be connected.

Furthermore, in the above embodiment, an example is shown in which the second substrate 20 extends in one direction only from the first substrate 10, but this may equally extend in a plurality of directions (two directions, three directions, or four directions).

Furthermore, at least a part of the interconnect patterns 12 and 22 of the first and second substrates 10 and 20 may be formed as a jumper lead spanning the interconnect pattern of the other substrate. By doing this, even if a multi-layer interconnect pattern is required on the substrate, using the single-sided substrates, a multi-layer construction can effectively be obtained at low cost.

A semiconductor device can also be constructed using an interconnect substrate fabricated in this way. The content described in this embodiment can, insofar as is possible also be applied to the following embodiments.

Second Embodiment

Figure 3:
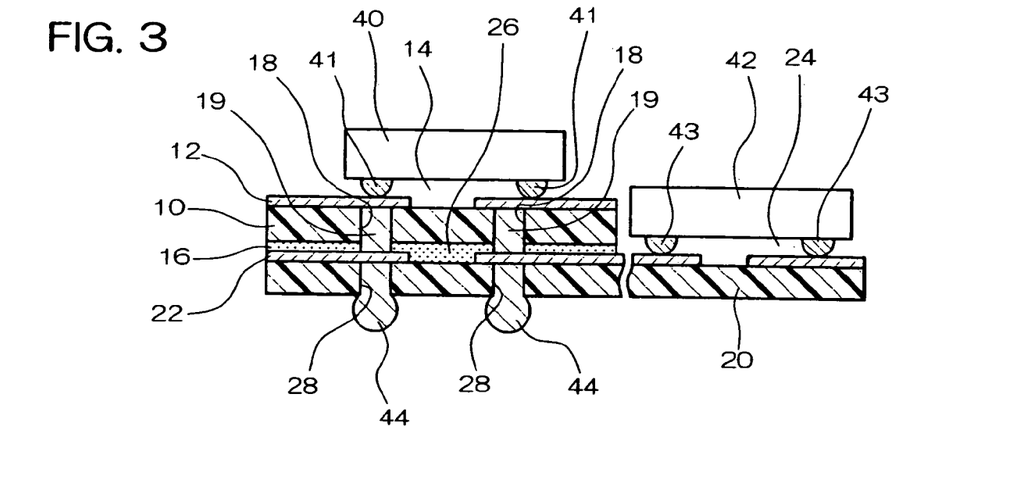
FIG. 3 shows a semiconductor device according to a second embodiment of the present invention.

FIG. 3 shows a second embodiment of the semiconductor device to which the present invention is applied. This embodiment of the semiconductor device includes the interconnect substrate explained in the first embodiment. The interconnect substrate is as explained in the first embodiment, detailed description is omitted. The surface of the first substrate 10 opposite to that on which the first interconnect pattern 12 is formed is adhered to the surface of the second substrate 20 on which the second interconnect pattern 22 is formed.

In the mounting region 14 of the first substrate 10, the semiconductor chip 40 is mounted. The semiconductor chip 40 is electrically connected to the first interconnect pattern 12. In more detail, electrodes 41 of the semiconductor chip 40 are electrically connected to the first interconnect pattern 12. The electrodes 41 are commonly bonded to lands of the interconnect pattern 12. On at least either of the part of the interconnect pattern 12 connecting to the electrodes 41, and the electrodes 41, bumps may be formed. For the bond between the interconnect pattern 12 and the electrodes 41, an anisotropic conductive film, solder, or a conductive paste, or the like may be used, or metal bonding using ultrasound may be applied. To the ultrasound may be added the application of heat or pressure. As shown in FIG. 3, the semiconductor chip 40 may be mounted so that the electrodes 41 are positioned over the through-holes 18, or may be mounted to avoid the through-holes 18. In the latter case, the distance from the external terminals 44 is increased, and the transmission of force is reduced, thus allowing improved reliability. The same is true also of the following embodiments.

In the mounting region 24 of the second substrate 20, the semiconductor chip 42 is mounted. The semiconductor chip 42 is electrically connected to the second interconnect pattern 22. In more detail, electrodes 43 of the semiconductor chip 42 and the second interconnect pattern 22 are electrically connected. In this respect, the details described above relating to the connection of the semiconductor chip 40 and the first interconnect pattern 12 may be applied. Between each of the semiconductor chips 40 and 42 and the first and second substrates 10 and 20, interposing a resin such as an underfill or the like not shown in the drawings is preferable from the viewpoint of increased reliability.

A plurality of external terminals 44 electrically connected to the second interconnect pattern 22 are provided on the second substrate 20. The external terminals 44 are provided on the surface of the second substrate 20 opposite to that on which the second interconnect pattern 22 is formed. For example, the external terminals 44 may be provided on the second interconnect pattern 22 via the through-holes 28 formed in the second substrate 20. The external terminals 44 can be formed of solder or the like. For example, cream solder may be provided in the through-holes 28 so as to project above the surface, and this may be fused to form ball-form terminals. Alternatively, solder may be provided in the through-holes 28, and plating with a conductive material applied, then solder balls mounted to form the external terminals 44.

In the description above, the mounting of the semiconductor chip on the interconnect pattern is described as being carried out by the face-down method, but equally, the face-up method by wire bonding, or the TAB method by flying leads may be applied. The above described method of mounting the semiconductor chip on the interconnect pattern may be used in the embodiments described below.

By means of this embodiment of the semiconductor device, since it is used as the interposer for an interconnect substrate described in the first embodiment, the cost can be reduced.

This embodiment is constructed as described above, and the method of manufacture thereof is now described.

First Example of the Method of Manufacture

In this example, the interconnect substrates already described in the first embodiment are taken, semiconductor chips 40 and 42 are mounted thereon, and external terminals 44 are provided. Since the details thereof will be clear from the above description, further description is omitted.

Second Example of the Method of Manufacture

In this example, the first and second substrates 10 and 20 are taken. Then before the first and second substrates 10 and 20 are adhered to constitute an interconnect substrate, at least one of the semiconductor chips 40 and 42 is mounted. For example, the semiconductor chip 40 is mounted on the mounting region 14 of the first substrate 10, and the semiconductor chip 42 is mounted on the mounting region 24 of the second substrate 20, and then the first and second substrates 10 and 20 are adhered.

Alternatively, one of the semiconductor chips 40 and 42 is mounted one of the mounting regions 14 and 24 of the first and second substrates 10 and 20, and the first and second substrates 10 and 20 are adhered, after which the other of the semiconductor chips 40 and 42 is mounted on the other of the mounting regions 14 and 24 of the first and second substrates 10 and 20.

When the first or second substrate 10 or 20 is formed by stamping out a flexible substrate, the semiconductor chip 40 or 42 may be mounted on the flexible substrate first, and then the first or second substrate 10 or 20 formed by stamping out.

When the second substrate 20 is formed by stamping out a flexible substrate, the first substrate 10 may be mounted on the flexible substrate before stamping out this flexible substrate to form the second substrate. In this case, the semiconductor chip 40 may be already mounted on the first substrate 10.

A plurality of first semiconductor chips 40 may be mounted on a first flexible substrate which is to form a plurality of first substrates 10, and this first flexible substrate adhered to a second flexible substrate which is to form a plurality of second substrates 20. Then the second flexible substrate may be stamped out to the outline form of the second substrates 20. By this means, the first flexible substrate is also cut to the outline form of the first substrate 10.

On the second substrate 20, a plurality of external terminals 44 are provided. This step may be carried out after forming the first and second substrates 10 and 20 and adhering the two together, and mounting the first and second semiconductor chips 40 and 42 on the first and second substrates 10 and 20, but is not limited by this. For example, the step of providing the external terminals 44 may be carried out before forming the second substrates 20, by provision beforehand on the second flexible substrate which is to form a plurality of second substrates 20. The step of providing the external terminals 44 may be carried out before mounting the second semiconductor chip 42 on the second substrate 20.

In this example, to the mutual relationship between the first and second substrates 10 and 20, the construction of the adherence of the two, the electrical connection construction, and so on, the description in the first embodiment can be applied, and the same is true of the method of manufacture.

When at least a part of the interconnect pattern of the first or second substrate 10 or 20 is formed as jumper leads, a semiconductor chip may be mounted on at least one of the substrates, and a multi-layer construction may effectively be achieved. This can also be applied to all of the following embodiments.

Third Embodiment

Figure 4:
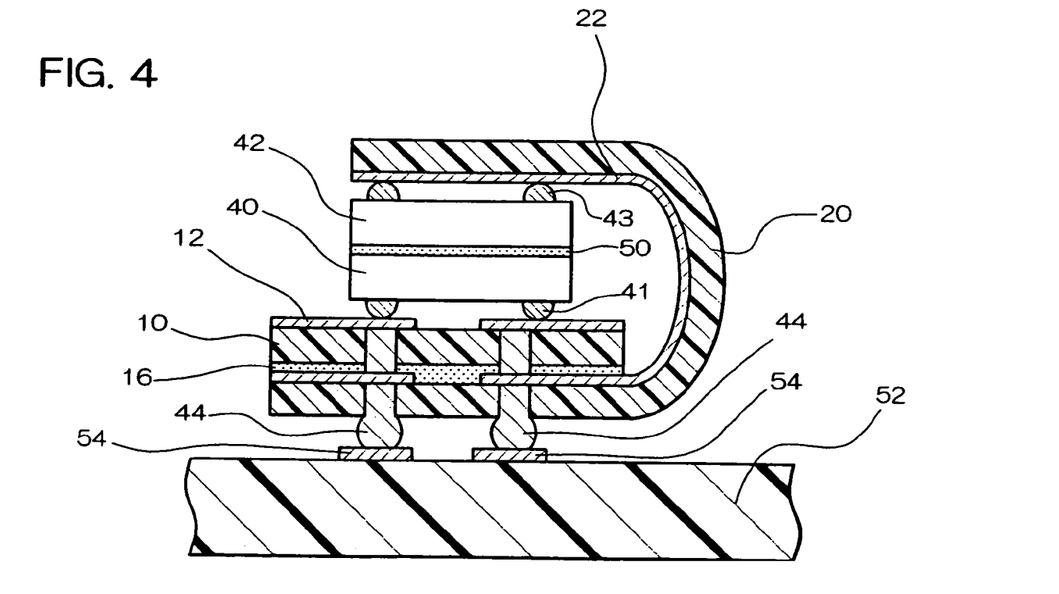
FIG. 4 shows a semiconductor device according to a third embodiment of the present invention.

FIG. 4 shows a third embodiment of the semiconductor device to which the present invention is applied. This embodiment of the semiconductor device includes the structural elements of the semiconductor device described in the second embodiment, and as these structural elements are the same as described in the second embodiment, detailed description is omitted here. The surface of the first substrate 10 opposite to that on which the first interconnect pattern 12 is formed is adhered to the surface of the second substrate 20 on which the second interconnect pattern 22 is formed.

In this embodiment, the second substrate 20 is bent. The first semiconductor chip 40 and second semiconductor chip 42 are adhered. In more detail, the surface of the first semiconductor chip 40 opposite to the surface of mounting on the first substrate 10, and the surface of the second semiconductor chip 42 opposite to the surface of mounting on the second substrate 20 are adhered. For the adhesion, an adhesive 50 can be used. Alternatively, a tacky adhesive can be used, or crimping, flip, or other mechanical methods may be used to maintain the bent state of the second substrate 20.

According to this embodiment of the semiconductor device, the first and second semiconductor chips 40 and 42 are overlaid to save space. When the second substrate 20 extends beyond the first substrate 10 in a plurality of directions, the second substrate 20 may be bent over in a plurality of directions. When a plurality of semiconductor chips are mounted, the second substrate 20 may be folded between the semiconductor chips.

The method of manufacture of this embodiment of the semiconductor device adds to the method of manufacture of the above described semiconductor device described in the second embodiment, a step of bending the second substrate 20, and adhering together the first semiconductor chip 40 mounted on the first substrate 10 and the second semiconductor chip 42 mounted on the second substrate 20. It should be noted that the external terminals 44 may be provided before bending the second substrate 20, or may be provided after bending the second substrate 20.

In FIG. 4, a semiconductor device fabricated in this way is mounted on a circuit board 52. For the circuit board 52 is generally used an organic substrate such as for example a glass epoxy substrate or the like. On the circuit board 52, an interconnect pattern 54 of for example copper is formed into a desired circuit, and the interconnect pattern 54 and the external terminals 44 of the semiconductor device are connected to achieve electrical conduction therebetween.

Fourth Embodiment

Figure 5:
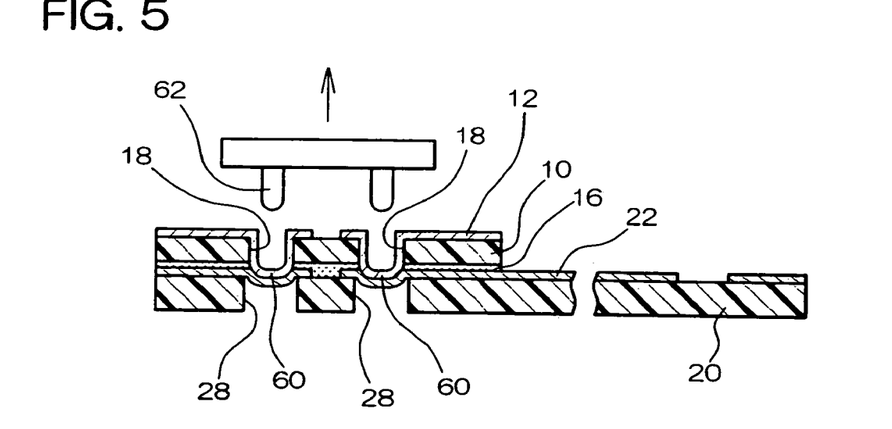
FIG. 5 shows the method of manufacture of an interconnect substrate according to a fourth embodiment of the present invention.

FIG. 5 shows a fourth embodiment of the interconnect substrate to which the present invention is applied. In this embodiment, a part of the first interconnect pattern 12 enters into the through-holes 18 formed in the first substrate 10, to connect to the second interconnect pattern 22. In more detail, within the through-holes 18, bent portions 60 formed from a part of the first interconnect pattern 12 are formed by pressing with a projection die 62. The bent portions 60 contact the second interconnect pattern 22. When the second interconnect pattern 22 within the through-holes 28 is bent, if supported from the direction opposite to the direction of application of pressure, the contact will be made easier. The projection die 62, either individually, or at a plurality of points, may be heated, and the bent portions 60 and second interconnect pattern 22 soldered or brazed, or may be bonded with a conductive adhesive or the like. Ultrasound bonding may be applied by applying ultrasound to the projection die 62. In place of the projection die 62, a single-point bonder may be used, and the bent portions 60 and second interconnect pattern 22 bonded one point at a time. On this occasion, the second interconnect pattern 22 within the through-holes 28 may be supported from the direction opposite to the direction of application of pressure during the bending. A precondition for this is that the through-holes 18 formed in the first substrate 10 are positioned over the second interconnect pattern 22. It should be noted that the bent portions 60 may partially rupture. To other aspects of the construction the description in the first embodiment can be applied. The surface of the first substrate 10 opposite to that on which the first interconnect pattern 12 is formed is adhered to the surface of the second substrate 20 on which the second interconnect pattern 22 is formed.

According to this embodiment, by means of the bent portions 60 the electrical connection of the first and second interconnect patterns 12 and 22 is achieved. As shown in FIG. 5, the through-holes 18 formed in the first substrate 10 and the through-holes 28 formed in the second substrate 20 may be formed in communicating positions. In this case, when the second interconnect pattern 22 is formed over the through-holes 28, a part of the second interconnect pattern 22 may enter the through-holes 28.

Figure 6:
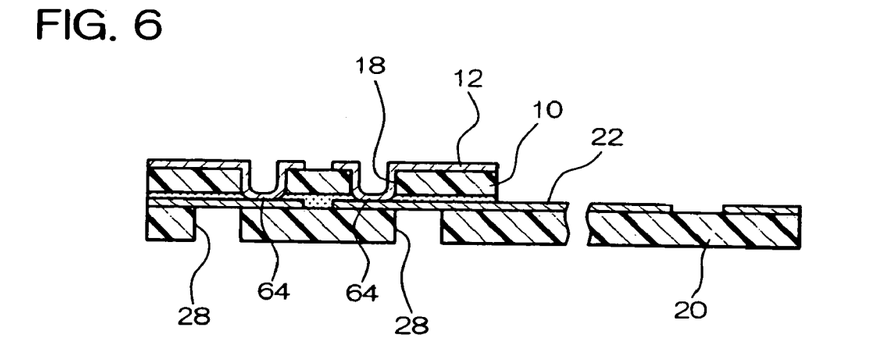
FIG. 6 shows a modification of the method of manufacture of an interconnect substrate according to the fourth embodiment of the present invention.

Alternatively, as shown in FIG. 6, the through-holes 18 formed in the first substrate 10 and the through-holes 28 formed in the second substrate 20 may be formed in offset positions. In this case, the bent portion 64 contacts or is bonded to a part of the second interconnect pattern 22 in intimate contact with the second substrate 20. The method for this is as described above.

The method of manufacture of this embodiment of the interconnect substrate uses the projection die 62 to press a part of the first interconnect pattern 12 into the through-holes 18. In more detail, the first interconnect pattern 12 passes over the through-holes 18 of the first substrate 10, and the part of the first interconnect pattern 12 over the through-holes 18 is pressed into the through-holes 18 by the projection die 62. In this way, the bent portions 60 can be formed. In that case, the second substrate 20 can be supported in the plane by a jig. This step is a connection step in which the first and second interconnect patterns 12 and 22 are electrically connected. It should be noted that the bent portions 60 may be formed in such a way that a part thereof is ruptured. The step of forming the bent portions 60 and the connection step allow the second interconnect pattern 22 to be bonded while bending the first interconnect pattern 12 in a single step, thus in this case reducing the number of steps.

When connecting the bent portions 60 and the second interconnect pattern 22, pressure is preferably applied to the bent portions 60 while squashing a part of the adhesive 16 out of the way, to cause an electrical connection to the second interconnect pattern. In this case, the adhesive 16 is preferably provided as a liquid or gel. In more detail, first, the adhesive 16 is provided on at least one of the first and second substrates 10 and 20 to include the portion of electrical connection between the two. Thereafter, before curing the adhesive 16, pressure is applied to the bent portions 60 in the direction of the second interconnect pattern 22, whereby a part of the adhesive 16 is squashed away to the outside of the bent portions 60. In this case, if ultrasonic vibration is applied to the bent portions 16, the electrical bond can be positively made. By means of this, it is not necessary to provide the adhesive 16 between the bent portions 60 and the second interconnect pattern 22, and the reliability of the electrical connection between the two is increased. It should be noted that this method can, insofar as is possible, be applied to all of the embodiments.

In this way, a semiconductor device using the thus fabricated interconnect substrate as an interposer can also be constructed.

Fifth Embodiment

Figure 7:
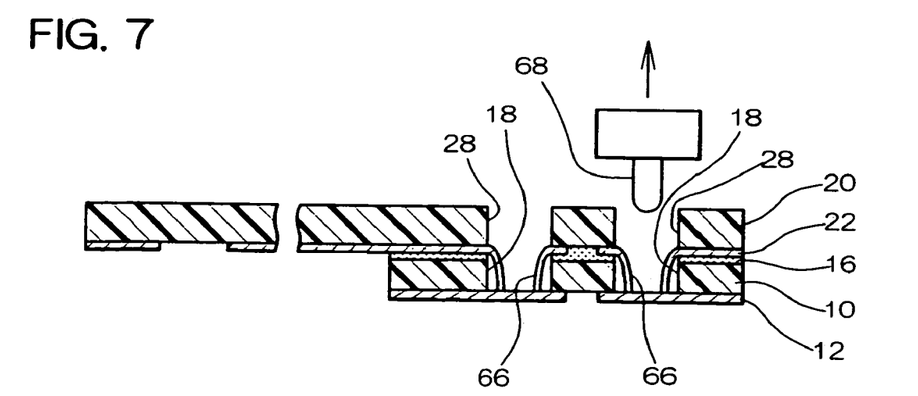
FIG. 7 shows the method of manufacture of an interconnect substrate according to a fifth embodiment of the present invention.

FIG. 7 shows a fifth embodiment of the interconnect substrate to which the present invention is applied. In this embodiment, a part of the second interconnect pattern 22 enters the through-holes 18 formed in the first substrate 10, to contact the first interconnect pattern 12. In more detail, within the through-holes 18, bent portions 66 are formed from a part of the second interconnect pattern 22. The bent portions 66 contact or are bonded to the first interconnect pattern 12. It should be noted that the bent portions 66 may, as shown in FIG. 7, partially rupture, or may be of a continuous form without rupture, as in the bent portions 60 shown in FIG. 5. To other respects of the constitution, and the method of forming and of bonding the description in the above described embodiments can be applied. It should be noted that the surface of the first substrate 10 opposite to that on which the first interconnect pattern 12 is formed is adhered to the surface of the second substrate 20 on which the second interconnect pattern 22 is formed. According to this embodiment, by means of the bent portions 66, electrical connection of the first and second interconnect patterns 12 and 22 is achieved.

In the method of manufacture of this embodiment of the interconnect substrate, using a projection die 68, a part of the second interconnect pattern 22 is pressed into the through-holes 18. To carry out this step, it is preferable that the through-holes 28 of the second substrate 20 and the through-holes 18 of the first substrate 10 are formed are formed in communicating positions.

In more detail, the projection die 68 is inserted into the through-holes 28 from the surface of the second substrate 20 opposite to that on which the second interconnect pattern 22 is formed. Then by means of the projection die 68, the second interconnect pattern 22 is pressed into the through-holes 18, and bonded to the first interconnect pattern 12. In this way, the bent portions 66 can be formed. This step is a connection step of electrically connecting the first and second interconnect patterns 12 and 22. Naturally, a plurality of points (plurality of locations) may be bonded in a single operation with a projection die having a plurality of projections.

In this way, a semiconductor device using the thus fabricated interconnect substrate as an interposer can also be constructed.

Sixth Embodiment

Figure 8:
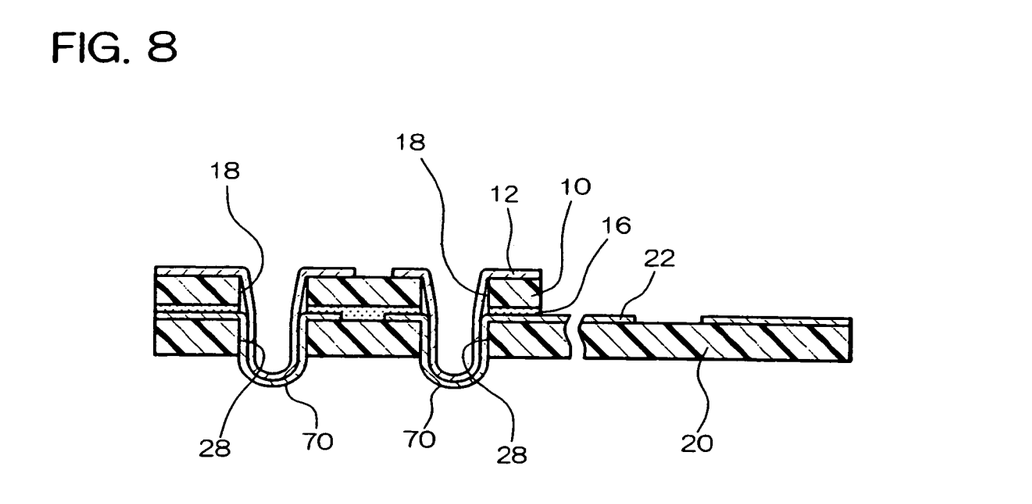
FIG. 8 shows the interconnect substrate according to a sixth embodiment of the present invention.

FIG. 8 shows a sixth embodiment of the interconnect substrate to which the present invention is applied. In this embodiment, the surface of the first substrate 10 opposite to that on which the first interconnect pattern 12 is formed is adhered to the surface of the second substrate 20 on which the second interconnect pattern 22 is formed.

A part of the second interconnect pattern 22 enters the through-holes 28 formed in the second substrate 20 to form external terminals 70. The second interconnect pattern 22 forms at least the outer wall of the external terminals 70. A part of the first interconnect pattern 12 enters the through-holes 18 and 28 formed in the first and second substrates 10 and 20, and connects, and contacts or is bonded with the second interconnect pattern 22.

The through-holes 18 formed in the first substrate 10 and the through-holes 28 formed in the second substrate 20 are formed in communicating positions. A part of the first interconnect pattern 12 enters the through-holes 28 of the second substrate 20, to form the internal wall of the external terminals 70. In other respects, the constitution, and the method of formation of any of the above described embodiments can be applied.

According to this embodiment, the external terminals 70 are formed from a part of the second interconnect pattern 22 or a part of the first and second interconnect patterns 12 and 22, and therefore a separate element for the external terminals is not required, and the component count can be reduced.

In the method of manufacture of this embodiment of the interconnect substrate, using the projection die 62 shown in FIG. 5, a part of the first interconnect pattern 12 is pressed into the through-holes 18, and furthermore, the second interconnect pattern 22 is pressed into the through-holes 28. When the external terminals 70 are to project beyond the second substrate 20, a part of the second interconnect pattern 22 is caused to project from the second substrate 20. When it is not necessary for the external terminals 70 to project beyond the second substrate 20, a part of the second interconnect pattern 22 may be fixed within the through-holes 28.

In the method of manufacture of this embodiment, the description of the method of manufacture in any of the above described embodiments can be applied. In this way, a semiconductor device using the thus fabricated interconnect substrate as an interposer can also be constructed.

In the fourth to sixth embodiments, if the gap between the first substrate 10 and second substrate 20 is adhered, the adhesion strength between the substrates increases, and the semiconductor device reliability is increased, which is even more preferable.

Seventh Embodiment

Figure 9:
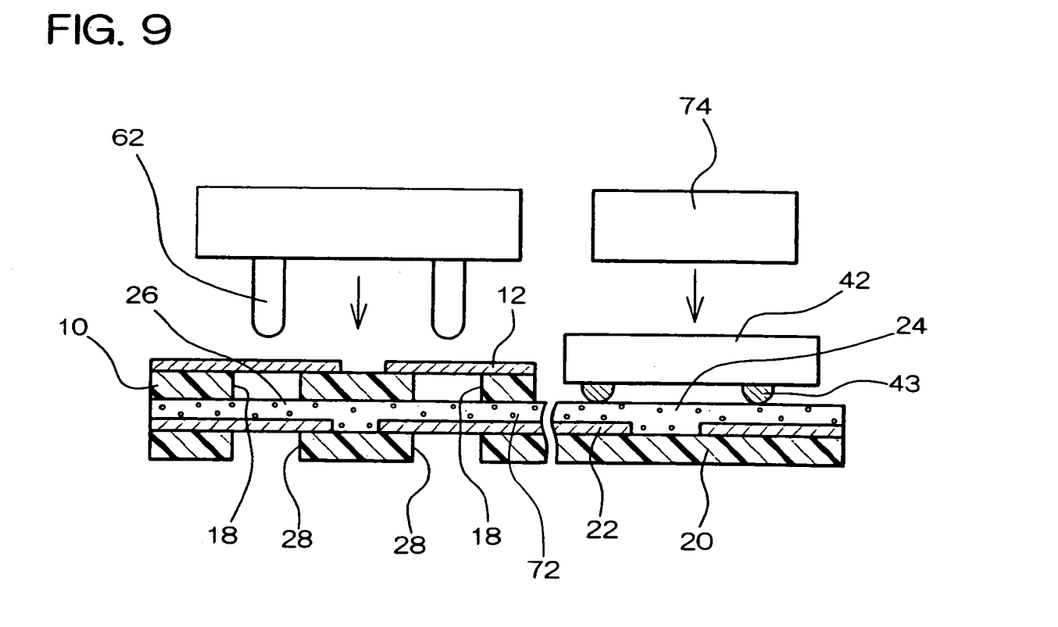
FIG. 9 shows the method of manufacture of an interconnect substrate according to a seventh embodiment of the present invention.

FIG. 9 is a figure showing the method of manufacture of a seventh embodiment of the interconnect substrate to which the present invention is applied. In this embodiment, in a step of disposition of the first and second substrates 10 and 20 an anisotropic conductive film 72 is used. That is to say, between the first and second substrates 10 and 20, the anisotropic conductive film 72 is interposed, to adhere the two. It should be noted that the anisotropic conductive film 72 may be an anisotropic conductive material already in tape form or sheet form, or may be a liquid anisotropic conductive material applied to at least one of the first and second substrates 10 and 20. The anisotropic conductive material has conductive particles dispersed in an adhesive. It should be noted that the surface of the first substrate 10 opposite to that on which the first interconnect pattern 12 is formed is adhered to the surface of the second substrate 20 on which the second interconnect pattern 22 is formed.

When the anisotropic conductive film 72 is provided on the surface of the second substrate 20 on which the second interconnect pattern 22 is formed, the second semiconductor chip 42 may be subjected to face-down bonding to the second substrate 20, with the anisotropic conductive film 72 interposed. In this case, the anisotropic conductive film 72 is preferably provided on both of the mounting region 24 for mounting the second semiconductor chip 42 and the region 26 of the second substrate 20 for adhering the first substrate 10. Then the step of disposition of the first and second substrates 10 and 20, and the second mounting step for the second semiconductor chip 40 can both be carried out at the same time, or one may be carried out, followed by the other.

By means of this, the material for adhering the first and second substrates 10 and 20 and the material for adhering the second semiconductor chip 42 to the second substrate 20 while forming an electrical connection are the same material. As a result, the component count can be reduced.

In the example shown in FIG. 9, after the step of disposition of the first and second substrates 10 and 20, the second mounting step for the second semiconductor chip 42, and an electrical connection step for the first and second interconnect patterns 12 and 22 are carried out. In more detail, in FIG. 9, between the first and second substrates 10 and 20 the anisotropic conductive film 72 is interposed, and the anisotropic conductive film 72 is also provided over the mounting region 24 for the second semiconductor chip 42 of the second substrate 20.

The second semiconductor chip 42 and the second substrate 20 are subjected to pressure by means of a pressure jig 74, and the second semiconductor chip 42 is subjected to face-down bonding to the second substrate 20. That is to say, the second mounting step for the second semiconductor chip 40 is carried out.

Using the projection die 62, in the same step as the step shown in FIG. 5, the first and second interconnect patterns 12 and 22 are electrically connected. That is to say, a connection step is carried out. Furthermore, using the projection die 62, by the same step as the step shown in FIG. 8, the external terminals 70 may be formed. In this embodiment, since the anisotropic conductive film 72 is interposed between the first and second interconnect patterns 12 and 22, the first and second interconnect patterns 12 and 22 may be electrically connected by the conductive particles.

It should be noted that in this embodiment, if the mounting step of the semiconductor chip 42 is eliminated, an interconnect substrate can be fabricated. The construction of this interconnect substrate is the content of the above description, with the semiconductor chip 42 eliminated.

Eighth Embodiment

Figure 10:
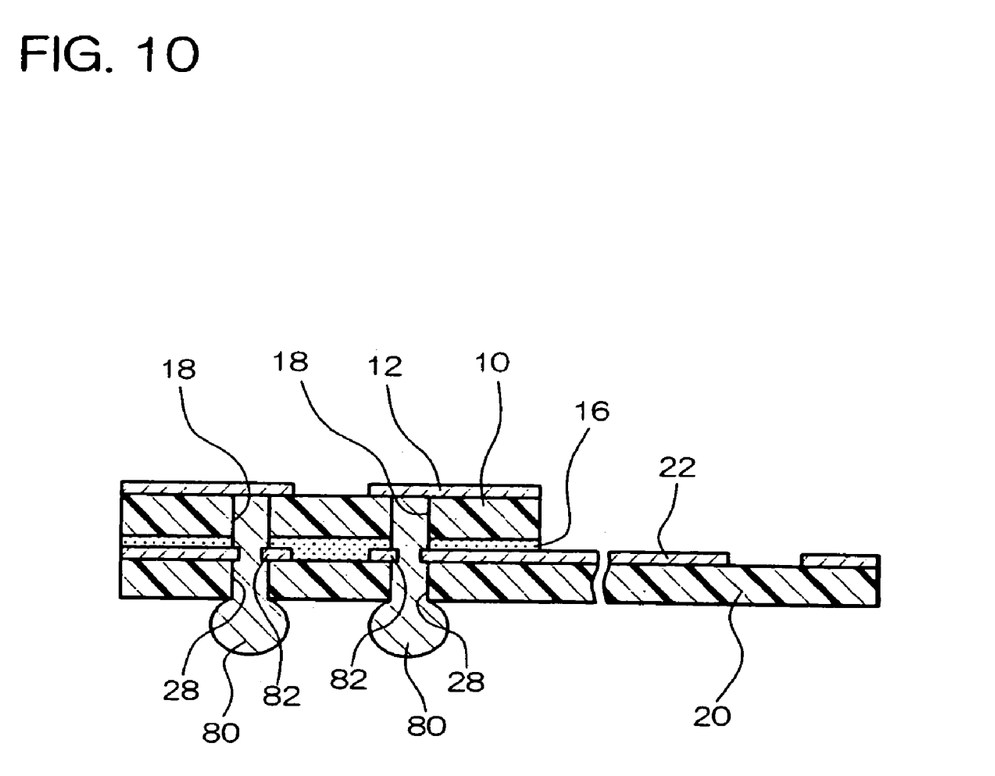
FIG. 10 shows the interconnect substrate according to an eighth embodiment of the present invention.

FIG. 10 shows an eighth embodiment of the interconnect substrate to which the present invention is applied. In this embodiment, the through-holes 18 and 28 of the first and second substrates 10 and 20 are formed in communicating positions. The first interconnect pattern 12 passes over the through-holes 18. A part of the second interconnect pattern 22 preferably projects into the through-holes 28 as exemplified by the projections 82 shown in FIG. 10, but as long as there is a space for the second interconnect pattern 22 and through-holes 28 to communicate, need not thus project. It is not required for a part of the second interconnect pattern 22 to contact the first interconnect pattern 12, but it may thus contact. It should be noted that the surface of the first substrate 10 opposite to that on which the first interconnect pattern 12 is formed is adhered to the surface of the second substrate 20 on which the second interconnect pattern 22 is formed.

In the communicating through-holes 18 and 28, a conductive material such as solder or the like is provided, and external terminals 80 are formed. The conductive material may be provided on the first interconnect pattern 12. The conductive material may be provided within the through-holes 28 in the second interconnect pattern 22, and bonded to the projections 82. By doing this, a single step of providing the conductive material is sufficient, and a shortening of the process can be achieved. Alternatively, the conductive material may contact the surface of at least a part of the second interconnect pattern 22. The conductive material constituting the external terminals 80 electrically connects the first and second interconnect patterns 12 and 22 via the through-holes 18 and 28.

According to this embodiment, by means of the conductive material electrically connecting the first and second interconnect patterns 12 and 22, the external terminals 80 can be formed integrally. Alternatively, the conductive material electrically connecting the first and second interconnect patterns 12 and 22 may be provided in the communicating through-holes 18 and 28, and solder balls or the like provided separately as terminal material.

In the method of manufacture of this embodiment of the interconnect substrate, first and second substrates 10 and 20, on which the first and second interconnect patterns 12 and 22 of the above described construction are formed, are adhered, and the conductive material is provided within the communicating through-holes 18 and 28. Then this conductive material is heated and fused, or solder balls or the like are provided as terminal material on this conductive material, to form the external terminals 80.

Using the interconnect substrate thus obtained, a semiconductor device may be fabricated. As part of the fabrication process of the semiconductor device, this embodiment may be applied.

Furthermore, in all of the above described embodiments, a construction with a plurality of substrates overlaid may be adopted. In this case, if the directions of extension of the overlaid substrates are such that the semiconductor chip is exposed, the mounting characteristics will be improved. Further in all of the embodiments, on each single substrate a plurality of semiconductor chips may be mounted.

In all of the above described embodiments, the external terminals 44 are not necessarily required, and a various means of extending the interconnects to the exterior may be used, as for example extensions of a substrate can be used as connectors, or connectors may be mounted, or other passive parts may be mounted on the substrate to complete a semiconductor module.

Figure 11:
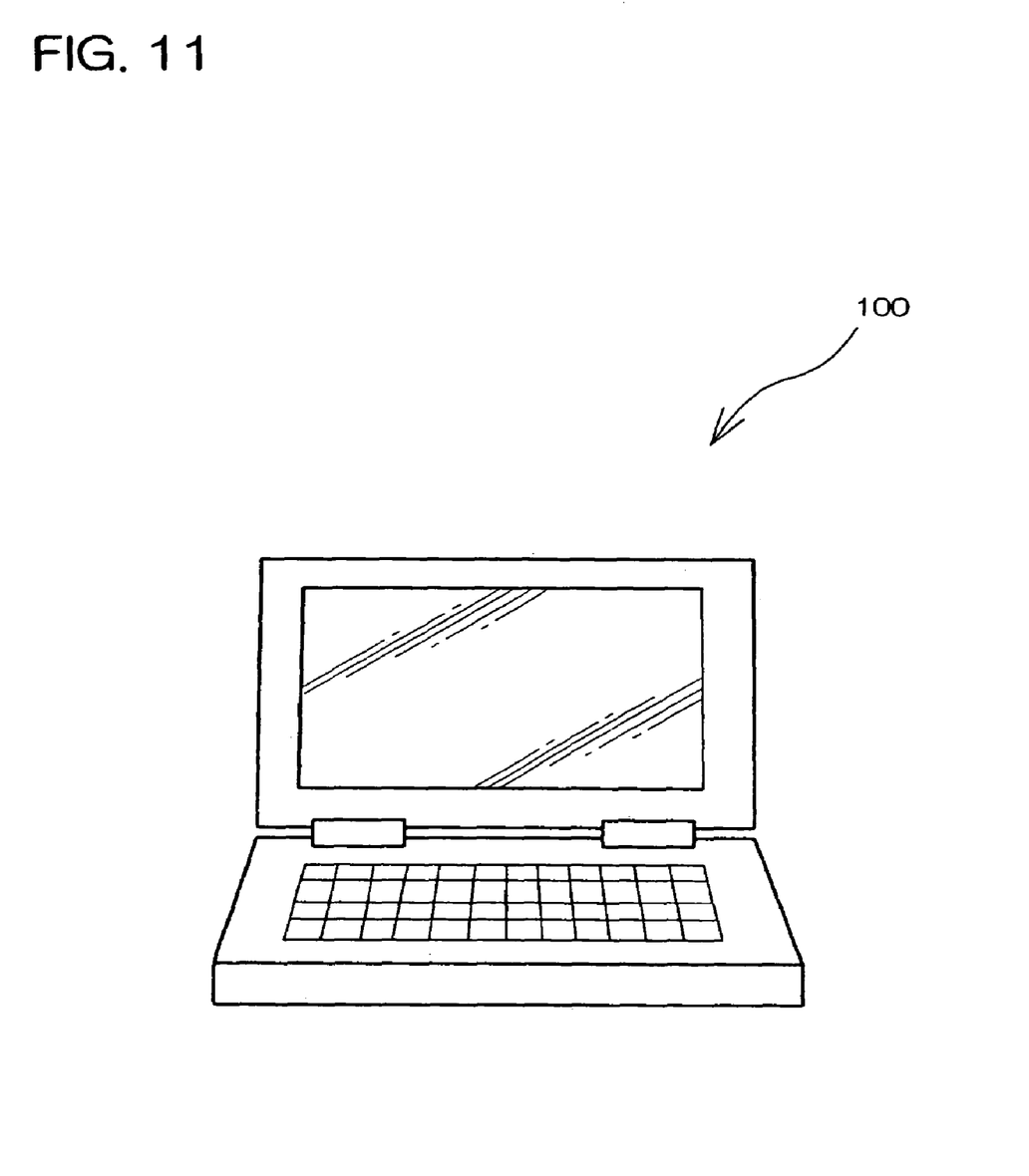
FIG. 11 shows an electronic instrument equipped with a semiconductor device manufactured by application of the method of the present invention.

As an electronic instrument having the semiconductor device to which the present invention is applied, FIG. 11 shows a notebook personal computer 100.

It should be noted that in the embodiments described above, "semiconductor chip" may be replaced by "electronic chip" (whether an active element or a passive element) which can be mounted on a substrate to manufacture an electronic component. Alternatively, a combination of semiconductor chips and electronic chips may be used. As electronic components manufactured using such an electronic chip may be cited, for example, optical elements, resistors, capacitors, coils, oscillators, filters, temperature sensors, thermistors, varistors, variable resistors, and fuses.

What is claimed is:

1. An electronic component comprising:
    a first substrate on which a first interconnect pattern is formed;
    a second substrate having a region which at least a part of the first substrate is disposed opposing, on which a second interconnect pattern is formed electrically connected to the first interconnect pattern;
    a first electronic chip electrically connected to the first interconnect pattern; and
    a second electronic chip electrically connected to the second interconnect pattern, wherein the first electronic chip is adhered to the second electronic chip, a surface of the first substrate opposite to a surface on which the first interconnect pattern is formed, and a surface of the second substrate on which the second interconnect pattern is formed are adhered together.

2. The electronic component as defined in claim 1, wherein a plurality of through-holes are formed in the first substrate, and the first interconnect pattern and the second interconnect pattern are electrically connected via the through-holes.

3. The electronic component as defined in claim 2, wherein:
    a plurality of through-holes are formed in the second substrate; and
    external terminals electrically connected to the second interconnect pattern via the through-holes formed in the second substrate are provided.

4. The electronic component as defined in claim 3, wherein:
    the through-holes formed in the first substrate and the through-holes formed in the second substrate are formed in communicating positions; and
    the external terminals contact the second interconnect pattern via the through-holes formed in the second substrate, and are provided on the first interconnect pattern via the through-holes formed in the first substrate.

5. The electronic component as defined in claim 1, wherein:
    an anisotropic conductive film including conductive particles is provided on the surface of the second substrate on which the second interconnect pattern is formed; and
    the anisotropic conductive film adheres the first substrate to the second substrate, while also electrically connecting the second interconnect pattern to the second electronic chip.

6. The electronic component as defined in claim 5, wherein the second substrate is bent to adhere the first electronic chip mounted on the first substrate to the second electronic chip mounted on the second substrate.

* * * * *